(12) United States Patent
Tamura et al.

(10) Patent No.: US 6,903,371 B2
(45) Date of Patent: *Jun. 7, 2005

(54) THIN FILM TRANSISTOR AND DISPLAY USING THE SAME

(75) Inventors: Takuo Tamura, Tokyo (JP); Kiyoshi Ogata, Tokyo (JP); Yoichi Takahara, Tokyo (JP); Kazuhiko Horikoshi, Tokyo (JP); Hironaru Yamaguchi, Tokyo (JP); Makoto Ohkura, Tokyo (JP); Hironobu Abe, Tokyo (JP); Masakazu Saitou, Tokyo (JP); Yoshinobu Kimura, Tokyo (JP); Toshihiko Itoga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/773,950

(22) Filed: Feb. 6, 2004

(65) Prior Publication Data

US 2004/0155295 A1 Aug. 12, 2004

Related U.S. Application Data

(63) Continuation of application No. 10/299,218, filed on Nov. 18, 2002, now Pat. No. 6,716,688, which is a continuation of application No. 09/910,314, filed on Jul. 19, 2001, now Pat. No. 6,657,227.

(30) Foreign Application Priority Data

Dec. 6, 2000 (JP) ........................................ 2000-376561

(51) Int. Cl.[7] .............................................. H01L 29/04
(52) U.S. Cl. ............................ 257/64; 257/59; 257/79; 257/316; 348/30; 348/450; 348/486
(58) Field of Search ............................... 257/59, 64, 79, 257/316; 438/30, 450, 486

(56) References Cited

U.S. PATENT DOCUMENTS 5,882,960 A    3/1999   Zhang et al.
5,904,550 A    5/1999   Yamaguchi
5,981,974 A    11/1999  Makita
6,015,720 A *  1/2000   Minegishi et al. ............. 438/30
6,150,203 A    11/2000  Yamazaki et al.
6,190,949 B1   2/2001   Noguchi et al.
6,294,441 B1 * 9/2001   Yamazaki .................... 438/486
6,608,324 B1 * 8/2003   Yamazaki et al. ............. 257/59
6,657,227 B2 * 12/2003  Tamura et al. ................ 257/64

FOREIGN PATENT DOCUMENTS

EP    0598394 A2    5/1994
JP    10-41234 A    2/1998
JP    11-195608 A   7/1999

OTHER PUBLICATIONS

Kuriyama et al. "Lateral Grain Growth of Poly–Si Films with a Specific Orientation by an Excimer Laser Annealing Method," Japanese Journal of Applied Physics Dec. 1993, vol. 32, pp. 6190–6195 (1993).

Kuriyama "Excimer laser crystallization of silicon films for AML CDs," Proceedings of Second International Workshop on Active Matrix Liquid Crystal Displays (AMLCDs '95) Sep. 25–26, 1995 Bethlehem, PA (1995).

Kuriyama et al. "Lateral Grain Growth in the Excimer Laser Crystallization of Poly–Si," Proceedings of the Materials Research Society Symposium Nov. 1993, vol. 321, pp. 657–662 (1993).

* cited by examiner

*Primary Examiner*—David Nelms
*Assistant Examiner*—Dao H. Nguyen
(74) *Attorney, Agent, or Firm*—Townsend and Townsend and Crew LLP

(57) ABSTRACT

An amorphous silicon film is laser irradiated a plural number of times to make the film composed of a plurality of crystal grains while suppressing the formation of protrusions at the boundaries of the adjoining grains to realize a polycrystalline silicon thin film transistor having at least partly therein the clusters of grains, or the aggregates of at least two crystal grains, with preferred orientation in the plane (111), and having high electron mobility of 200 $cm^2/Vs$ or above.

6 Claims, 7 Drawing Sheets

300mJ/cm² LASER IRRADIATION : 1 TIME

300mJ/cm² LASER IRRADIATION : 20 TIMES

500mJ/cm² LASER IRRADIATION : 20 TIMES

500mJ/cm² LASER IRRADIATION : 1 TIME

THIN FILM TRANSISTOR AND DISPLAY USING THE SAME

CROSS REFERENCE TO RELATED APPLICATION

This application is a continuation of U.S. application Ser. No. 10/299,218, Filed Nov. 18, 2002, now U.S. Pat. No. 6,716,688, which is a continuation of U.S. application Ser. No. 09/910,314, filed Jul. 19, 2001, now U.S. Pat. No. 6,657,227 B2, which is related to and claims priority from Japanese Patent Application No. 2000-376561, Dec. 6, 2000, each of which are incorporated by reference herein in the entirety for all purposes.

BACKGROUND OF THE INVENTION

The present invention relates to a thin film transistor, particularly to one using low-temperature polycrystalline silicon, flat panel display devices using such a thin film transistor, such as liquid crystal display device and electron luminescence display device, and a method of manufacturing them.

Hitherto, thin film transistor devices used for flat panel displays have been manufactured, as for instance described in (1) '99 Latest Liquid Crystal Processing Techniques (Nikkei BP, 1999), pp. 53–59 (especially page 54), by forming an amorphous silicon film on a glass substrate by PE-CVD (plasma enhanced chemical vapor deposition), subjecting this amorphous silicon film to dehydration annealing for reducing hydrogen contained in the film, and then further subjecting it to excimer laser annealing to make the film polycrystalline.

According to the method of forming a crystalline semiconductor film described in (2) JP-A-11-354801, an oxide film is formed on an amorphous silicon film after cleaning this silicon film with an ozone-containing solution, then the oxide film is removed with a fluoric acid solution, and thereafter the silicon film is subjected to laser annealing to obtain a polycrystalline silicon film free of or minimized in surface protrusions. Any of these polycrystalline silicon films, however, fell short of providing a satisfactory result.

SUMMARY OF THE INVENTION

An object of the present invention is to provide a thin film transistor making use of a polycrystalline silicon film provided with high electron mobility and reliability by suppressing the formation of protrusions at the grain boundaries.

The present invention provides a thin film transistor comprising a semiconductor thin film formed on a substrate, said semiconductor film being composed of a plurality of crystal grains and having present at least partly therein the clusters of grains, or the aggregates of at least two of said crystal grains.

The present invention also provides a thin film transistor comprising, laminated on a substrate, a thin semiconductor film, a channel, an insulator film, a gate electrode, a source electrode and a drain electrode, wherein said source and drain are connected to a source region and a drain region, respectively, provided at least in a region of said semiconductor film with said channel interposed therebetween, and said semiconductor film has present at least partly therein the clusters of grains, which were formed by the aggregation of two or more of the crystal grains having (111) preferred orientation in the direction substantially parallel to the substrate surface.

The present invention further provides a method of manufacturing a thin film transistor comprising the steps of forming a thin film of an amorphous semiconductor on a substrate, and subjecting the film to laser irradiation for heating it, wherein said laser irradiation is conducted a plural number of times to form clusters of crystal grains in at least part of said amorphous film.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE INVENTION

Figure 1:
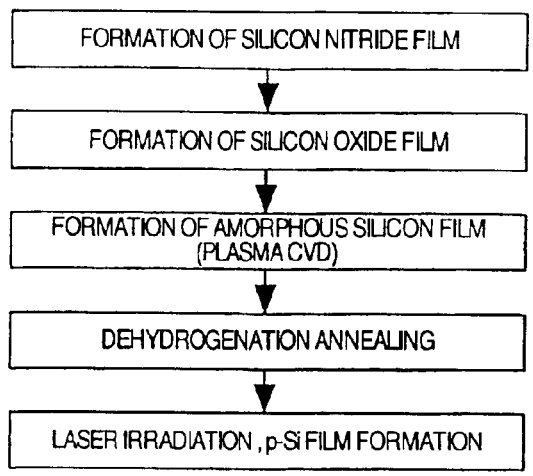
FIG. 1 is a flow chart of the process for forming a thin film of polycrystalline silicon in an embodiment of the present invention.

Generally, there is an interrelation between grain size and electron mobility of a polycrystalline silicon film, i.e., the smaller the grain size, the lower is electron mobility. This is ascribed for one thing to the fact that electron mobility is controlled by scattering of electrons at the grain boundaries.

When the amorphous silicon film is crystallized by laser annealing, the crystals do not grow up to a sufficient size, with the maximum grain size of polycrystalline silicon film after crystallization being not greater than 100 nm, if the laser irradiation energy density is small.

In case the above-mentioned prior art (1) is used for crystallization, it is possible to realize an enlargement of grain size by increasing the laser irradiation energy density. In this case, however, there are formed protrusions of as large as 50 nm or even greater at the grain boundaries with the enlargement of grain size, and this has been an obstacle to the application of the above art to the thin film transistor manufacturing process. That is, according to this art, when an insulator film is formed on a crystallized silicon film having large protrusions, these protrusions would degrade reliability of insulator film.

On the other hand, it is possible to decrease the protrusions arising from the grain boundaries after laser annealing by using the above-mentioned prior technique (2). In this case, however, as it is an essential requirement to conduct a cleaning treatment with a fluoric acid solution or pure water before laser annealing, not only the process is complicated but also a reduction of throughput becomes unavoidable, which are the serious drawbacks to this art in its application to the production of crystallized silicon films.

The present invention has for its object to solve the above problems and to provide a high reliability thin film transistor making use of a polycrystalline silicon film having high electron mobility and reliability, realized by drastically suppressing the formation of protrusions at the grain boundaries, and a method of manufacturing such a thin film transistor.

The above object of the present invention can be attained by forming a thin semiconductor film on a substrate, said semiconductor film being composed of a plurality of crystal grains with a size of not greater than 500 nm, and treating the film to form the clusters of grains, or the aggregates of two or more of crystal grains, at least partly in said film.

The crystal grains are composed of Si, Ge or SiGe, and in the clusters consisting of such crystal grains, the individual grains have the same crystal orientation in the area where the individual grains adjoin each other, so that although there apparently exist the grain boundaries, it is possible to produce the substantially same characteristics as shown by the single crystals.

The crystal orientation of the individual grains composing the clusters is identified by the transmission electron microscopical (TEM) observation of crystal lattice pattern or by the observation of electron backscattering diffraction (EBSD) pattern.

The present invention provides a thin semiconductor film characterized in that the film has said clusters present at least partly therein, and that the average film thickness is 10 to 100 nm.

The present invention is further characterized by the fact that it is possible to adopt the X-ray diffraction intensity ratio as an index of preferred orientation, and that the ratio of X-ray diffraction intensity of (111) plane to that of (220) plane, as measured by X-ray diffraction of the planes parallel to the substrate surface, is 5 or greater.

The present invention is also typified in that the surface roughness (Rmax) of the film is 30 nm or less, with the standard deviation (RMS) thereof being 10 nm or less, and the protrusions at the grain boundaries are reduced.

It is also a feature of the present invention that the average electron mobility of the semiconductor film is 200 cm$^2$/V·s or above.

Further, in the thin film transistor using said semiconductor film according to the present invention, the clusters of grains, or the aggregates of two or more of crystal grains having (111) preferred orientation in the direction parallel to the substrate surface, are allowed to exist in said film.

The crystalline semiconductor film having said clusters of grains therein can be obtained from a process which comprises forming an amorphous semiconductor film on a substrate and laser irradiating this amorphous film a pertinent number of times to crystallize at least part of the film. It is possible to form a crystalline semiconductor film having preferred crystal orientation and suppressed information of protrusions at the grain boundaries.

Preferred embodiments of the present invention are described below.

(1) A thin film transistor comprising a semiconductor thin film disposed on a substrate, said semiconductor film being composed of a plurality of crystal grains and having present at least partly therein the clusters of grains which are the aggregates of two or more of said crystal grains.

(2) A thin film transistor set forth in (1) above, wherein said clusters of grains are the aggregates of two or more of the crystal grains having a size of 500 nm or less.

(3) A thin film transistor set forth in (1) above, wherein said clusters of grains are the aggregates of two or more of the crystal grains having the substantially same crystal orientation.

(4) A thin film transistor set forth in (3) above, wherein said crystal orientation of the crystal grains is identified at least by the transmission electron microscopical observation of crystal lattice pattern or by the observation of electron backscattering diffraction pattern.

(5) A thin film transistor set forth in (1) above, wherein the average thickness of said semiconductor film in the direction vertical to the substrate is 10 to 100 nm.

(6) A thin film transistor set forth in (1) above, wherein said semiconductor film contains Si, Ge or a compound of Si and Ge.

(7) A thin film transistor set forth in (1) above, wherein said clusters of grains have (111) preferred orientation in the direction substantially parallel to the substrate surface.

(8) A thin film transistor set forth in (1) above, wherein said clusters of grains have (111) preferred orientation in the direction substantially parallel to the substrate surface, and the X-ray diffraction intensity ratio of the (111) plane to the (220) plane of said clusters is 5 or greater.

(9) A thin film transistor set forth in (1) above, wherein surface roughness (Rmax) of said semiconductor film is 30 nm or less.

(10) A thin film transistor set forth in (1) above, wherein the standard deviation (RMS) of surface roughness of said semiconductor film is 10 nm or less.

(11) A thin film transistor set forth in (1) above, wherein average electron mobility of said semiconductor film is 200 cm$^2$/V·s or above.

(12) A thin film transistor comprising a substrate and laminated thereon a thin semiconductor film, a channel, an insulator film, a gate electrode, a source electrode and a drain electrode, wherein said source and drain are connected to a source region and a drain region, respectively, provided at least in a region of said semiconductor film with said channel being interposed therebetween, and said semiconductor film has present at least partly therein the clusters of grains formed by the aggregation of two or more of the crystal grains having (111) preferred orientation in the direction substantially parallel to the substrate surface.

(13) A thin film transistor set forth in (12) above, wherein the X-ray diffraction intensity ratio of the crystal plane (111) to the crystal plane (220) of said semiconductor film in said channel is at least greater than the X-ray diffraction intensity ratio of the crystal plane (111) to the crystal plane (220) of said semiconductor film in said source and drain regions.

(14) A thin film transistor set forth in (13) above, wherein the X-ray diffraction intensity ratio of the crystal plane (111) to the crystal plane (220) of said semiconductor film in said channel is 10 or greater.

(15) A method of manufacturing a thin film transistor comprising the steps of forming an amorphous semiconductor film on a substrate, and irradiating this amorphous semiconductor film with laser light to heat the film, wherein said laser irradiation is conducted a plural number of times to form clusters of grains in at least part of said amorphous semiconductor film.

Embodiments of the present invention will be explained in detail with reference to the accompanying drawings.

FIG. 1 is a flow chart of the process for forming a thin polycrystalline silicon film embodying the present invention. Although the explanation is here limited to the process for forming a thin silicon film, the same process can be applied for forming a similar thin film of germanium or a silicon-germanium compound.

First, a silicon nitride film (50 nm thick) is formed on a glass substrate (Corning 7059 glass is here used as substrate) by plasma enhanced chemical vapor deposition (plasma CVD). On this film is formed a silicon oxide film (100 nm thick), and thereon is further formed an amorphous silicon film (50 nm thick), both by plasma CVD.

Then the thus formed thin films on the substrate are subjected to annealing, for instance, in a 450° C. furnace for 30 minutes, for dehydrogenation of the amorphous silicon film.

Thereafter, the dehydrogenated amorphous silicon film is crystallized by applying, for instance, XeCl excimer laser (wavelength: 308 nm) to the film. Energy density of laser light used in the instant embodiment is 300 to 500 mJ/cm$^2$.

Also, in this embodiment, laser irradiation is conducted a plural number of times on a same part of the amorphous silicon film to crystallize it. Here, a plural number of times of laser irradiation was conducted according to the formula in which after first laser irradiation, the amorphous silicon film is scanned by laser light at predetermined intervals, and then again laser irradiation is carried out, with these steps being repeated a desired number of times. Thus, as laser irradiation and scanning at predetermined intervals are repeated, the same part of the amorphous silicon film substantially undergoes a plural number of times of laser irradiation. The actual number of times of laser irradiation, laser beam width, laser scanning width, etc., are properly selected depending on the purpose of use of the product. When, for instance, the laser beam width is 600 $\mu$m and its scanning width is 30 $\mu$m, then the number of times of laser irradiation on the same part of the amorphous silicon film is 20.

Figure 2:
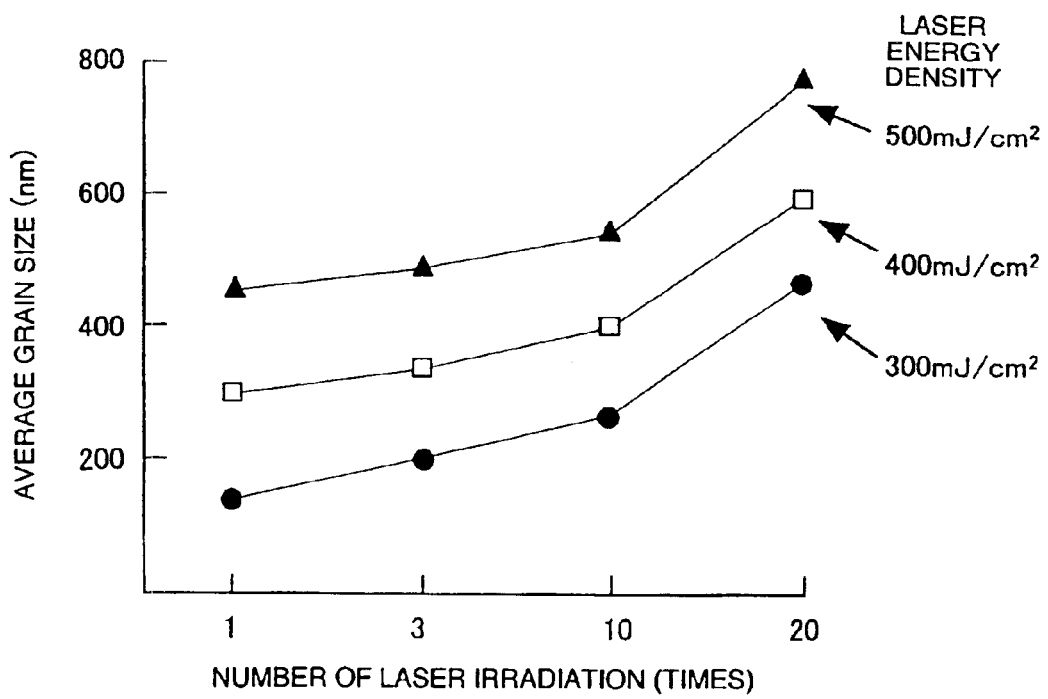
FIG. 2 is a graph illustrating the relation between the crystallization conditions (irradiation energy density and number of times of irradiation) by laser irradiation and the average grain size of the formed polycrystalline silicon crystals in an embodiment of the present invention.

FIG. 2 shows the results of crystallization of an amorphous silicon film by laser irradiation conducted by changing the number of times of irradiation within the range of 1 to 20 times while varying laser energy density within the range of 300 to 500 mJ/cm$^2$. In the graph of FIG. 2, the number of times of laser irradiation is plotted as abscissa and the average grain size in the region where laser irradiation was conducted a predetermined number of times is plotted as ordinate.

Grain size was determined by the scanning electron microscopical observation, a well known method in the art. Specifically, the major and minor axes of the grains were measured from the SEM image, and the mean value was defined as grain size.

In the calculation of grain size by the scanning electron microscopical observation, in order to make clear discrimination of the boundaries of the individual grains, the surface of the polycrystalline silicon film, which has previously been crystallized, is subjected to light etching using a fluoric acid solution. As for the average grain size, all of the grains with their sizes falling within the range of 10 $\mu$m×10 $\mu$m were observed and the sizes of the individual grains were measured, with the average value of measurements being defined as average grain size under the specified laser irradiation conditions.

As is seen from FIG. 2, in case laser irradiation is carried out with an energy density of 300 mJ/cm$^2$, the average grain size is approximately 150 nm after only one laser irradiation, while the average grain size increases to 450 nm after 20 times of laser irradiation, which indicates that the average grain size enlarges remarkably with the increase of the number of times of laser irradiation. The same tendency is observed when the laser energy density is 400 mJ/cm$^2$ or 500 mJ/cm$^2$.

It is notable here that when laser irradiation is conducted once at a laser energy density of 500 mJ/cm$^2$, the average grain size is approximately 450 nm, which is almost equal to the average grain size obtained when laser irradiation is carried out 20 times at a laser energy density of 300 mJ/cm$^2$.

This means that when laser light having a certain degree of large energy density is applied to the amorphous silicon film, there are formed the silicon crystals having a corresponding degree of grain size, and that even when using laser light with a smaller energy density, if laser irradiation is conducted a plural number of times, the crystal grains grow to the same degree of size.

However, the crystal grains of the same degree of size greatly differ from each other in crystallographic, physical and electrical properties as discussed later.

Surface roughness of a crystalline silicon film produced under the above-said conditions was evaluated by the AFM method well known in the art. Results are shown in FIG. 3.

Figure 3:
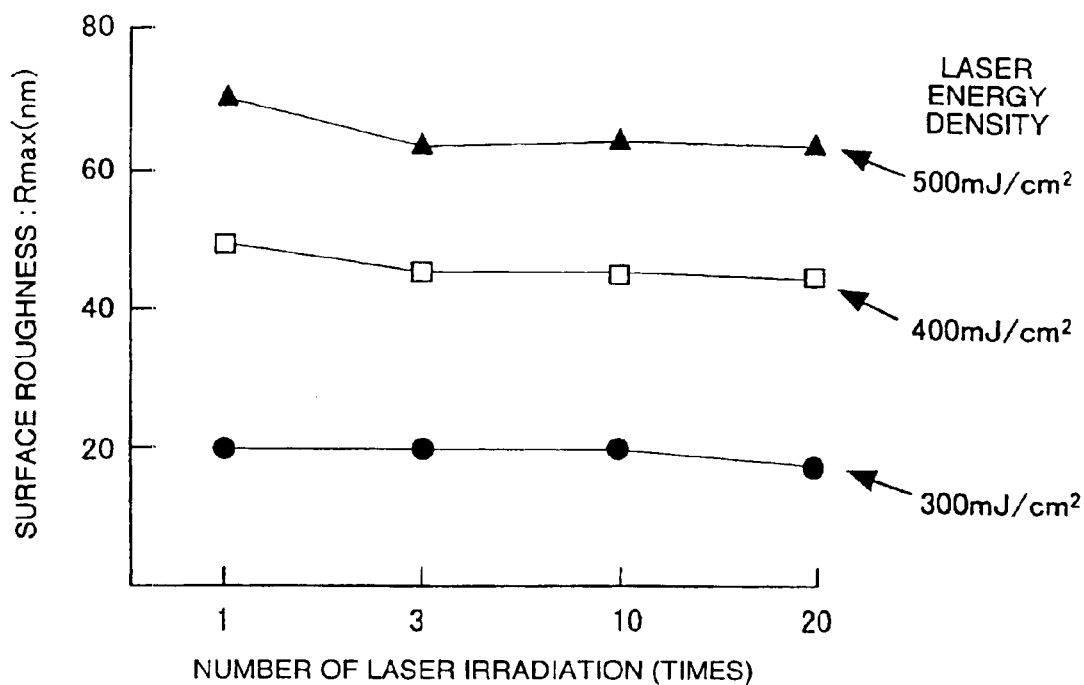
FIG. 3 is a graph illustrating the relation between the crystallization conditions (irradiation energy density and number of times of irradiation) by laser irradiation and surface roughness (Rmax) of the formed polycrystalline silicon film in an embodiment of the present invention.

In the graph of FIG. 3, the number of times of laser irradiation, varied in the range of 1 to 20 times, is plotted as abscissa. As parameter, laser energy density was changed in the range of 300 to 500 mJ/cm$^2$. Surface configuration of the crystalline thin films was measured in the area of 20 $\mu$m×20 $\mu$m at the arbitrary points of the samples produced under the respective conditions. The maximum unevenness in the above measuring area was expressed as Rmax for an index of roughness, and it was plotted as ordinate.

As a result, Rmax after one laser irradiation at a laser energy density of 300 mJ/cm$^2$ was approximately 20 nm, and this value was almost independent of the number of times of laser irradiation. It was also found that even when the laser energy density was raised to 400 mJ/cm$^2$ or 500 mJ/cm$^2$, Rmax remained almost independent of the number of times of laser irradiation although the absolute value of surface roughness increased.

In case laser irradiation is carried out at a laser energy density of, for instance, 400 mJ/cm$^2$, Rmax is approximately 50 nm after one irradiation and approximately 45 nm after 20 times of irradiation. In case the laser energy density is 500 mJ/cm², Rmax is approximately 70 nm after one irradiation and still about 65 nm even after 20 times of irradiation.

Synthetic consideration on the results of measurement of average grain size shown in FIG. 2 and surface roughness (Rmax) shown in FIG. 3 clarified the following facts.

When laser irradiation is conducted on an amorphous silicon film to crystallize it, average grain size enlarges remarkably with the increase of the number of times of irradiation, but the surface roughness (Rmax) is almost unchanged, and especially the surface roughness (Rmax) formed by the initial laser irradiation remains unaffected by a plural number of times of succeeding laser irradiation.

In the instant embodiment of the present invention, as is noted from the comparison between the case of 20 times of laser irradiation at a laser energy dnesity of 300 mJ/cm² and the case of only one laser irradiation at an energy density of 500 mJ/cm², average grain size is substantially same—approximately 450 nm—in both cases, but surface roughness (Rmax) differs greatly between the two cases, that is, Rmax is about 18 nm in the case of the former irradiation conditions whereas it is 65 nm in the case of the latter irradiation conditions.

Thus, the fact was disclosed that when it is desired to enlarge only those of the crystal grains which are present in the laser irradiation region while keeping the surface roughness (Rmax) low, it is very effective to carry out a plural number of times of irradiation with laser light having a relatively low energy density.

Figure 4A:
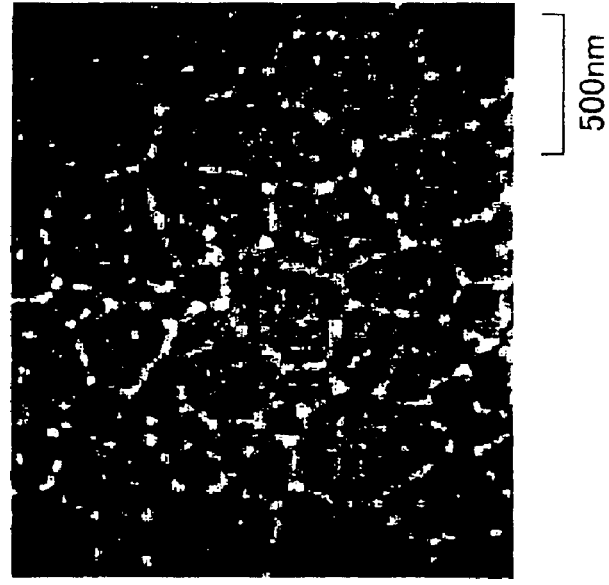
FIGS. 4A and 4B are SEM images of the polycrystalline silicon film surface in an embodiment of the present invention, with FIG. 4A showing the result when laser irradiation was conducted once at a laser energy density of 300 mJ/cm$^2$ and FIG. 4B showing the result when laser irradiation was conducted 20 times at a laser energy density of 300 mJ/cm$^2$.
Figure 4B:
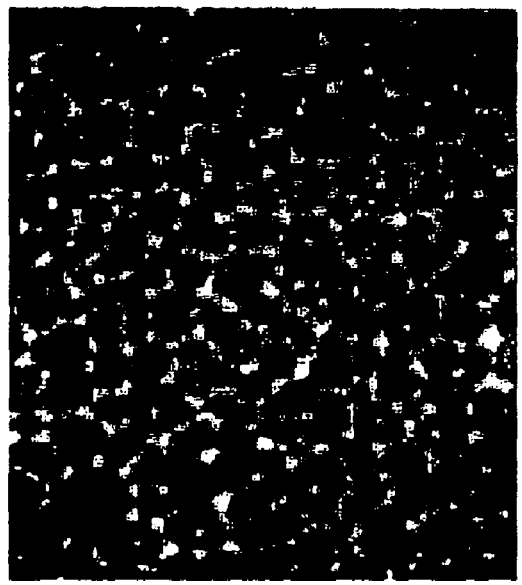
Figure 5B:
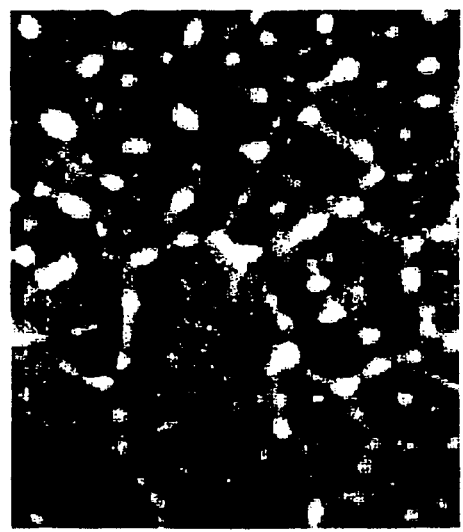
FIGS. 5A and 5B are SEM images of the polycrystalline silicon film surface in an embodiment of the present invention, with FIG. 5A showing the result when laser irradiation was conducted once at a laser energy density of 500 mJ/cm$^2$, and FIG. 5B showing the result when laser irradiation was conducted 20 times at a laser energy density of 500 mJ/cm$^2$.
Figure 5A:

Then the relation between laser energy density and number of times of irradiation was examined from the aspect of surface configuration of the formed polycrystalline silicon crystals. FIGS. 4A and 4B are the SEM photographs of the polycrystalline silicon film surface after laser irradiation at a laser energy density of 300 mJ/cm², and FIGS. 5A and 5B are the similar images after laser irradiation at a laser energy density of 500 mJ/cm². FIGS. 4A and 5A show the results after one irradiation and FIGS. 4B and 5B show the results after 20 times of irradiation.

As is seen from these results, a region of small grains are formed when laser irradiation is conducted once at an energy density of 300 mJ/cm² (FIG. 4A), but the small grains congregate to form clusters when laser irradiation is carried out a plural number of times at the same energy density (FIG. 4B). However, when laser irradiation is conducted only once at an energy density of 500 mJ/cm², although the grains per se are enlarged, there is seen no trace of congregation of the small grains (FIG. 5A) such as shown in FIG. 4B. It is also noted that the small grains grow up to clusters partially as laser irradiation is repeated.

As is appreciated from the above results of SEM observation of the crystal surface configuration, it is considered that when laser irradiation is conducted a plural number of times at a relatively small energy density, the crystal grains which normally have small surface protrusions are caused to aggregate while maintaining the original size of surface protrusions to grow up to larger aggregates, or clusters.

Figure 6:
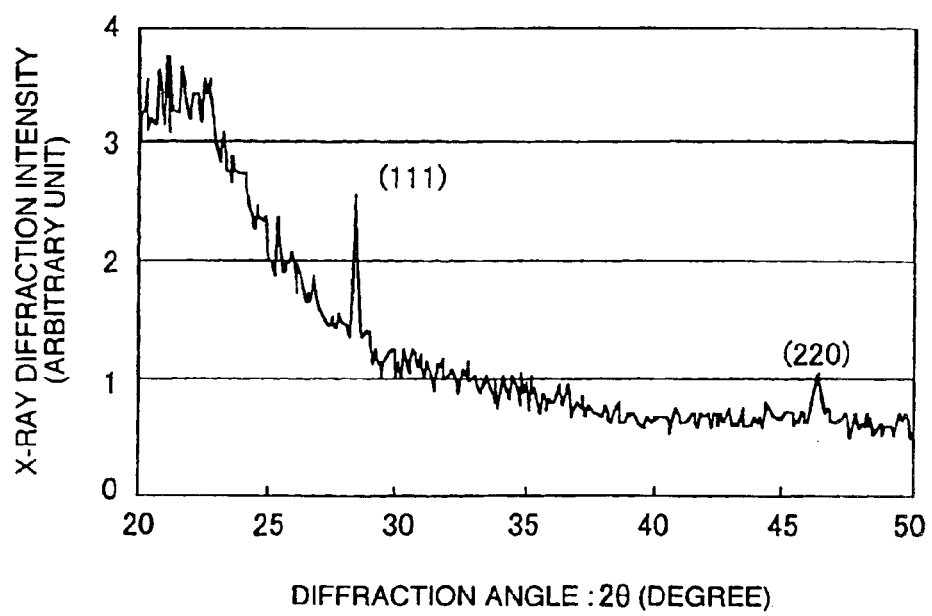
FIG. 6 is a typical illustration of the result of X-ray diffraction analysis of the polycrystalline silicon film in an embodiment of the present invention.

FIG. 6 shows the result of measurement by X-ray diffraction of the laser irradiation region. In this instance, laser irradiation was carried out 20 times at an energy density of 300 mJ/cm² to crystallize the amorphous silicon film.

As a result, there were observed distinct peaks indicating the crystal planes (111) and (220), respectively, in the region where crystallization was effected by laser irradiation.

So, as an index to indicate the degree of crystal growth from the amorphous to crystalline state, the ratio of diffraction intensity at the plane (111) to that at the plane (220) ((111)/(220) diffraction intensity ratio) was defined as crystal orientation index.

Generally, this crystal orientation index is about 1.8 when the polycrystalline silicon film has a perfect random orientation. The greater the value of this index, the more the crystal is oriented on the plane (111).

Figure 7:
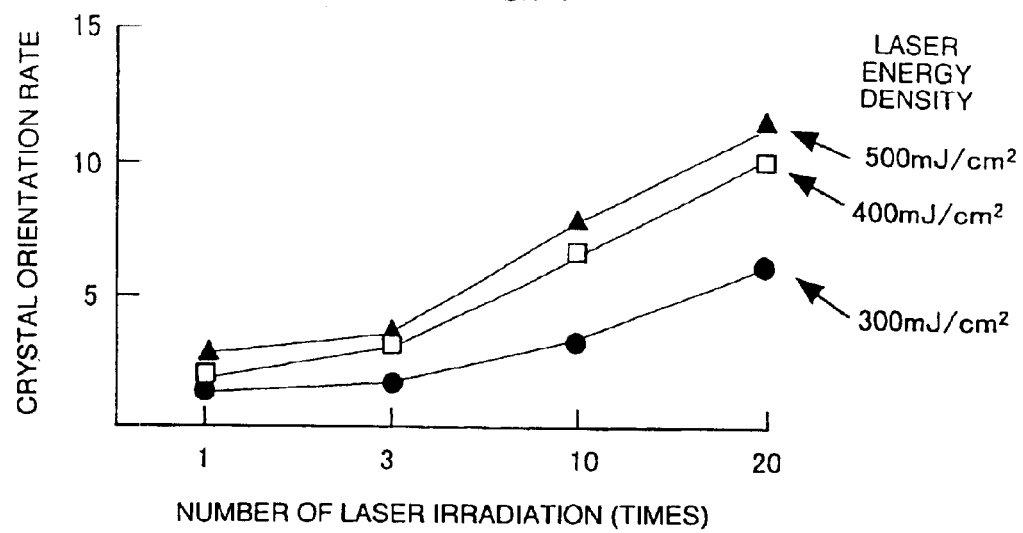
FIG. 7 is a graph showing the relation between the crystallization conditions (irradiation energy density and number of times of irradiation) by laser irradiation and the (111) crystal orientation index of the formed polycrystalline silicon film in an embodiment of the present invention.

FIG. 7 illustrates the relation between laser irradiation conditions (energy density and number of times of irradiation) and crystal orientation index.

As is seen from the graph, when laser irradiation is conducted once at an energy density of 300 mJ/cm², the crystal orientation index representing the (111)/(220) diffraction intensity ratio has a value approximate to random orientation. And as the number of times of laser irradiation increases, the (111) crystal orientation index begins to rise sharply. The same tendency is seen when using laser light having other energy densities.

However, what is to be noted here particularly is the fact that the crystal orientation index becomes greater when irradiation is conducted 20 times with laser light having an energy density of 300 mJ/cm² than when conducting irradiation only once with laser light having a higher energy density such as 400 mJ/cm² or 500 mJ/cm². That is, in the former case, it is possible to realize a higher degree of (111) crystal orientation.

In the instant embodiment of the present invention, when laser irradiation was conducted 20 times, the crystal orientation index was 6, 10 and 12 for the laser energy densities of 300 mJ/cm², 400 mJ/cm² and 500 mJ/cm², respectively.

These high crystal orientation indices may be accounted for by the fact that as explained with reference to the relation between laser irradiation conditions and grain size shown in FIG. 2, when crystal growth is urged by the method of irradiating the amorphous silicon film with laser light, the repetition of laser irradiation causes the individual crystal grains formed by laser irradiation to aggregate and grow up upon every irradiation, and in the course of this growing process, the grains are steadily prompted to have crystal orientation on the plane (111).

Observation of the crystal lattice pattern by transmission electron microscropy is an effective means for confirming that the crystal grains are caused to aggregate and grow up into clusters by a plural number of times of laser irradiation.

Figure 8:
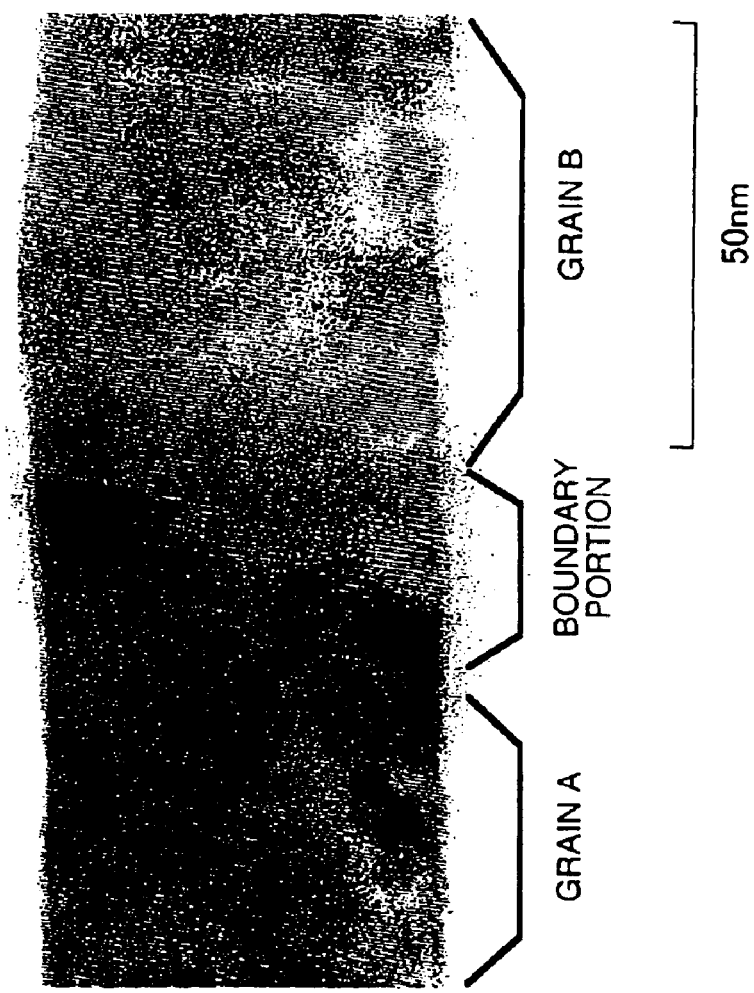
FIG. 8 is a transmission electron micrograph illustrating the crystal grains and their boundaries in the polycrystalline silicon film in an embodiment of the present invention.

FIG. 8 is a cross-sectional transmission electron micrograph of the boundary portion where the grains congregate in a polycrystalline silicon film after 20 times of irradiation with laser light having an energy density of 300 mJ/cm². The size of the clusters is approximately 500 nm. As is evident from this micrograph, grain A and grain B adjoin each other with the same crystal orientation at the boundary portion.

In other words, it can be said that the clusters formed by the aggregation of at least two grains by a plural number of times of irradiation with laser light having a predetermined energy density have substantially the same properties as the single crystals.

The result of evaluation by transmission electron microscopy is shown in FIG. 8, but similar evaluation results can be obtained by other means capable of evaluating crystal properties.

Figure 9:
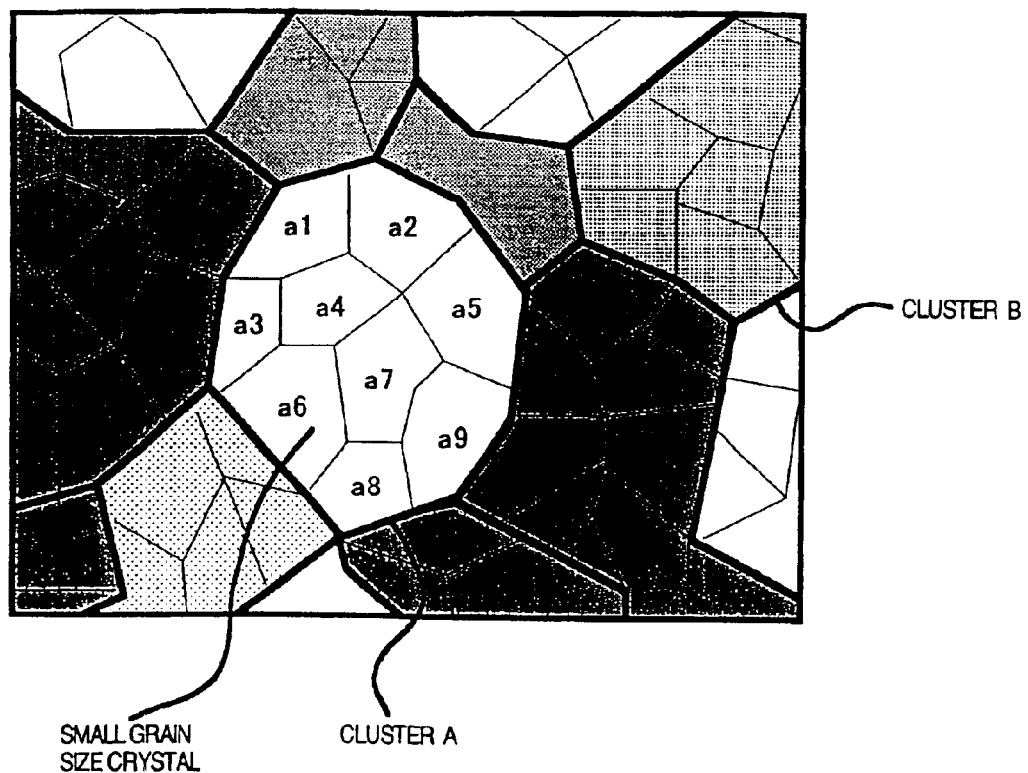
FIG. 9 is a schematic illustration of the relation between the state of clusters and their crystal orientation, as determined by the electron backscattering diffraction (EBSD) method, in the polycrystalline silicon film in an embodiment of the present invention.

FIG. 9 illustrates the result of evaluation of crystallographic orientation of the laser irradiated polycrystalline silicon film by the electron backscattering diffraction method well known in the art.

This electron backscattering diffraction method is a method in which electron beams focused to approximately 100 nm are applied to the object of measurement, and the crystallographic orientation of the object is determined by detecting the diffracted beams from the object. Since the diameter of the electron beams applied is around 100 nm, this method is capable of analyzing the crystal orientation of the individual grains in the crystal surface.

In FIG. 9, the result of measurement by electron backscattering diffraction on the substantially same region as shown in FIG. 4B is schematically illustrated. In the drawing, the portions enclosed by the bold lines are the clusters (indicated by cluster A, cluster B, etc.) in which a plurality of small-sized grains (indicated by a1, a2, etc.) aggregate. The parts indicated by the fine lines in the clusters are the boundaries of the adjoining grains.

The crystal grains were examined closely by the said electron backscattering diffraction method, and the grains having the same crystallographic orientation were marked with the same sign for discrimination from the others. As a result, it was found that although the polycrystalline silicon film is composed of the clusters having various patterns of crystal orientation, all of the individual grains composing a cluster show the same orientation, and although the grain boundaries exist, the clusters themselves possess substantially the same properties as the single crystals.

As explained above, it is possible to suppress the formation of protrusions at the boundaries of the adjoining grains and to let grow the larger-sized congregational grains, or clusters, by laser irradiating the amorphous silicon film a plural number of times.

In the present embodiment of the invention, Corning 7059 glass was used as substrate, but it is possible to use transparent substrates made of other materials such as quartz or poly(ethylene terephthalate) (PET). Also, in the present embodiment, an amorphous silicon film is formed by plasma CVD and this film is subjected to furnace annealing at an ambient temperature of 450° C. to dehydrogenate the film, but this amorphous silicon film can be formed by other methods such as low pressure chemical vapor deposition (LPCVD), sputtering and evaporation.

Further, the film material is not limited to silicon; mixtures containing at least silicon or germanium can be used as well. Also, XeCl excimer laser (wavelength: 308 nm) used in the instant embodiment is not the only means for crystallization; it is possible to use other types of excimer laser such as KrF laser (wavelength: 248 nm), YAG laser and Ar laser.

Now, manufacture of a thin film transistor using the said polycrystalline silicon film is described as another embodiment of the present invention.

Figure 10:
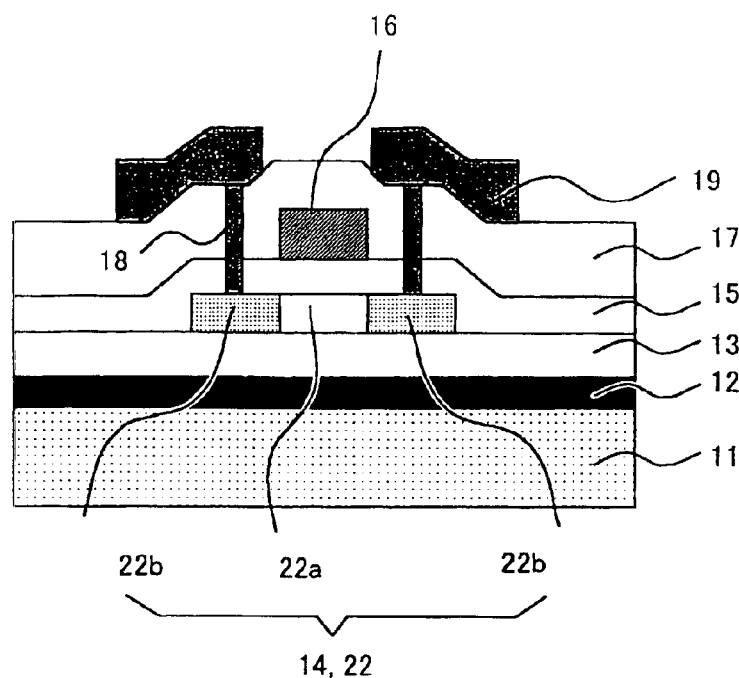
FIG. 10 is a schematic sectional view of the structure of a thin film transistor using the polycrystalline silicon film in another embodiment of the present invention.

FIG. 10 is a schematic sectional view showing the epitome of a thin film transistor comprising a glass substrate 11 and laminated thereon successively a first ground layer 12, a second ground layer 13, a semiconductor silicon layer 14, an insulating layer 15, a gate electrode layer 16, an insulating layer 17, contact holes 18 and electrodes 19.

First, a silicon nitride film 12 (50 nm thick) is formed as the first ground layer on a Corning 7059 glass substrate by plasma CVD well known in the art. On this silicon nitride film 12 is formed a silicon oxide film 13 (100 nm thick) as the second ground layer by plasma CVD. There is further formed thereon an amorphous silicon film 14 (50 nm thick), also by plasma CVD. The glass substrate may be a transparent substrate made of quartz, PET (poly(ethylene terephthalate)) or the like. The amorphous silicon film 14 may be formed by other methods such as LPCVD, sputtering or evaporation.

Then the glass substrate 11 having the amorphous silicon film 14 formed thereon is subjected to furnace annealing at 450° C. for 30 minutes to dehydrogenate the film. In this embodiment, furnace annealing was carried out in a nitrogen atmosphere.

Thereafter, the amorphous silicon film 14 is crystallized by XeCl excimer laser (wavelength: 308 nm, pulse width: 20 sec.). It is possible to use other types of excimer laser, such as KrF laser (wavelength: 248 nm), YAG laser, Ar laser, etc. The crystallization operation is carried out under the following conditions: laser energy density=300 to 500 mJ/cm$^2$; number of times of irradiation=1 to 20. Laser irradiation was conducted in vacuum in this embodiment, but the same result can be obtained by conducting laser irradiation under a nitrogen atmosphere.

Next, a prescribed pattern is formed on the polycrystalline silicon film by photolithography well known in the art, and then an insulator film of SiO$_2$ is formed over the patterned polycrystalline silicon film 22 by, for example, plasma CVD. In this embodiment, the SiO$_2$ insulator film 15 was 100 nm thick.

Then an electrode layer 16 designed to serve as gate is formed by sputtering well known in the art. TiW (film thickness: 200 nm) was used for the electrode layer 16 in the instant embodiment.

The electrode layer 16 is photolithographed into a prescribed pattern, and then, with this electrode layer 16 used as mask, ion implantation is carried out in the polycrystalline silicon film 22 to form a channel 22a, a source domain 22b and a drain domain 22b. In case of forming an n-type semiconductor, phosphorus is implanted as n-type dopant, and in case of forming a p-type semiconductor, boron is implanted as p-type dopant.

Further, in order to make up for the possible damage to the polycrystalline silicon layer 22 after ion implantation, rapid thermal annealing (RTA) is carried out. Furnace annealing may be employed for this treatment.

Then, an insulating layer of SiO$_2$ 17 (500 nm thick) is formed again by plasma CVD so as to cover the electrode layer 16, and contact holes 18 are formed at the predetermined positions of said insulating layer 17 to secure electrical connection with the source 22b and drain 22b. Further, electrode layers 19 (TiW/Al multi-layer films) corresponding to the source 22b and drain 22b, respectively, are formed in a way to fill up the inside of the contact holes.

Finally, the laminate structure is subjected to annealing in hydrogen at 400° C. for 60 minutes to complete a thin film transistor using a polycrystalline silicon film.

Figure 11:
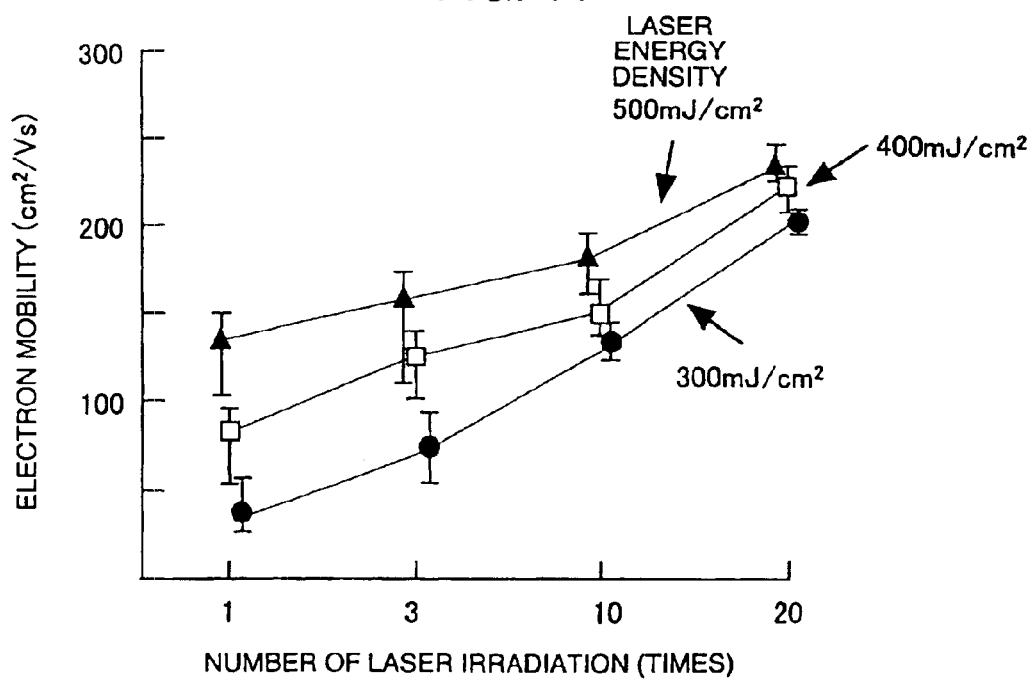
FIG. 11 is a graph illustrating the relation between the crystallization conditions (irradiation energy density and number of times of irradiation) by laser irradiation and electron mobility.

FIG. 11 is a graphic illustration of the relation between electron mobility of the thin film transistor manufactured by the above-described method and crystallization conditions (laser energy density and number of times of irradiation) of the amorphous silicon film. For the sake of reliability in the measurement of properties of the thin film transistor, measurement was made at 50 points for each item of measurement and the mean value of the properties and scatter thereof were shown in the graph.

As is seen from FIG. 11, the mean value of electron mobility shows a conspicuous rising tendency with the increase of the number of times of laser irradiation, and this tendency remains unchanged even when the laser energy density is changed.

Quite remarkably, it was revealed that even when the laser energy density used for the crystallization of amorphous silicon film is relatively low, such as 300 mJ/cm$^2$, it is possible to realize an almost same degree of electron mobility as provided by the rise of laser energy density (500 mJ/cm$^2$) and to also lessen the scatter of properties by increasing the number of times of laser irradiation.

On the other hand, it was found that when the thin film transistor which had undergone 20 times of laser irradiation for crystallization was operated under the ordinary driving conditions, the property variation of the thin film transistor, for example increase of threshold voltage, became more conspicuous as the laser energy density used for the crystallization was increased, resulting in a reduced functional performance of the transistor. This is probably for the reason that in the channel layer 22a where the electrons are free to move, the size of the protrusions formed at the boundaries of the adjoining grains becomes greater as the irradiation energy density elevates (see FIG. 3), and such protrusions act to impair the insulating properties of the gate insulator film 13 formed over the channel layer 22a.

From the above results, it was found that in order to realize a thin film transistor using a polycrystalline silicon film which exhibits high electron mobility and high reliability, it is imperative to reduce the energy density of laser used for the crystallization down to a pertinent value and to repeat laser irradiation.

By applying the above findings to the parts such as drive circuits in an active matrix type liquid crystal display device, it is possible to provide a high quality liquid crystal display device capable of realizing excellent display quality.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. A display comprising a thin film transistor disposed on a substrate, said thin film transistor comprising the substrate and laminated thereon a semiconductor thin film, a channel, an insulator film, a gate electrode, a source electrode and a drain electrode, wherein said source and drain electrodes are connected to a source region and a drain region, respectively, provided at least in a region of said semiconductor thin film with said channel being interposed therebetween, said semiconductor thin film comprising a plurality of crystal grains and having at least partly present therein clusters of grains which are aggregates of two or more of said crystal grains having substantially the same crystal orientation, wherein grains comprising one cluster of grains have a crystal orientation different from grains comprising one or more adjacent clusters of grains.

2. The display according to claim 1, wherein said clusters of grains have (111) preferred orientation in the direction substantially parallel to the substrate surface.

3. The display according to claim 1, wherein said substrate is one member selected from the group consisting of a glass substrate, a transparent substrate made of quartz, and a transparent substrate made of polyethylene terephthalate (PET).

4. A liquid crystal display comprising a thin film transistor disposed on a substrate for at least a driving circuit, said thin film transistor comprising the substrate and laminated thereon a semiconductor thin film, a channel, an insulator film, a gate electrode, a source electrode and a drain electrode, wherein said source and drain electrodes are connected to a source region and a drain region, respectively, provided at least in a region of said semiconductor thin film with said channel being interposed therebetween, said semiconductor thin film comprising a plurality of crystal grains and having at least partly present therein clusters of grains which are aggregates of two or more of said crystal grains having substantially the same crystal orientation, wherein grains comprising one cluster of grains have a crystal orientation different from grains comprising one or more adjacent clusters of grains.

5. The liquid crystal display according to claim 4, wherein said clusters of grains have (111) preferred orientation in the direction substantially parallel to the substrate surface.

6. The liquid crystal display according to claim 4, wherein said substrate is one member selected from the group consisting of a glass substrate, a transparent substrate made of quartz, and a transparent substrate made of polyethylene terephthalate (PET).

* * * * *